US012690111B2

(12) United States Patent
Quitsch et al.

(10) Patent No.:  US 12,690,111 B2
(45) Date of Patent:       Jul. 21, 2026

(54) LIGHTING DEVICE FOR A MOTOR VEHICLE

(71) Applicant: Hella GmbH & Co. KGaA, Lippstadt (DE)

(72) Inventors: Wolf Alexander Quitsch, Beckum (DE); Alexander Schwan, Kamen (DE); Ingo Wegener, Bad Wünnenberg-Helmern (DE); Mario Zehanciuc, Büren (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 19/211,942

(22) Filed: May 19, 2025

(65) Prior Publication Data

US 2025/0365836 A1     Nov. 27, 2025

(30) Foreign Application Priority Data

May 22, 2024    (DE) .......................... 102024114237.5

(51) Int. Cl.
*H05B 47/155*          (2020.01)
*F21S 41/153*          (2018.01)
(Continued)

(52) U.S. Cl.
CPC .......... *H05B 47/155* (2020.01); *F21S 41/153* (2018.01); *F21S 41/192* (2018.01);
(Continued)

(58) Field of Classification Search
CPC ..... H05B 47/155; H05B 47/17; F21S 41/153; F21S 41/192; H10H 20/821
See application file for complete search history.

(56) References Cited

U.S. PATENT DOCUMENTS

| | | | |
|---|---|---|---|
| 7,202,613 B2 * | 4/2007 | Morgan ............... | H05B 47/155 |
| | | | 315/312 |
| 8,646,956 B2 * | 2/2014 | Hering .................. | F21S 41/143 |
| | | | 362/543 |

(Continued)

FOREIGN PATENT DOCUMENTS

| | | |
|---|---|---|
| DE | 102019132236 A1 | 6/2021 |
| EP | 3026705 A1 | 6/2016 |

*Primary Examiner* — Bryon T Gyllstrom
(74) *Attorney, Agent, or Firm* — Husch Blackwell LLP

(57)          ABSTRACT

A lighting device is provided for a motor vehicle, and contains a light source with numerous light-emitting diodes with which pixels in a light distribution generated outside the motor vehicle are generated in a targeted manner. Each of the light-emitting diodes has a light-emitting surface. The light-emitting surfaces are placed in first and second rows to form a matrix, in which the light distribution extends horizontally (X) and vertically (Y) outside the motor vehicle. The light source contains at least one first light-emitting diode with first light-emitting surfaces, and at least one second light-emitting diode with second light-emitting surfaces. The first light-emitting surfaces are smaller than the second light-emitting surfaces. The lighting device operates the at least one first light-emitting diode with a first current, and the at least one second light-emitting diode with a second current. The first current is weaker than the second.

14 Claims, 2 Drawing Sheets

(51) Int. Cl.

|  |  |
|---|---|
| *F21S 41/19* | (2018.01) |
| *F21W 102/13* | (2018.01) |
| *F21Y 115/10* | (2016.01) |
| *H05B 47/17* | (2020.01) |
| *H10H 20/821* | (2025.01) |

(52) U.S. Cl.

CPC ........... *H05B 47/17* (2020.01); *H10H 20/821* (2025.01); *F21W 2102/13* (2018.01); *F21Y 2115/10* (2016.08)

(56) References Cited

U.S. PATENT DOCUMENTS

| | | | | |
|---|---|---|---|---|
| 12,409,773 | B1 * | 9/2025 | Zhu | B60Q 1/0023 |
| 2003/0072154 | A1 * | 4/2003 | Moore | H05B 45/44 |
| | | | | 362/234 |
| 2005/0275626 | A1 * | 12/2005 | Mueller | H05B 47/125 |
| | | | | 345/156 |
| 2013/0009554 | A1 * | 1/2013 | Ho | H05B 47/155 |
| | | | | 315/158 |
| 2020/0273397 | A1 * | 8/2020 | Jeong | G09G 3/32 |
| 2020/0328327 | A1 * | 10/2020 | He | H10H 29/142 |
| 2022/0020777 | A1 * | 1/2022 | Baek | H10D 86/441 |
| 2022/0412530 | A1 * | 12/2022 | Mimoun | F21S 41/663 |
| 2023/0020077 | A1 * | 1/2023 | Deckers | H05K 1/181 |
| 2024/0377041 | A1 * | 11/2024 | Spinger | B60Q 1/04 |
| 2025/0053111 | A1 * | 2/2025 | Zhu | B41J 2/455 |

* cited by examiner

LIGHTING DEVICE FOR A MOTOR VEHICLE

CROSS REFERENCE

This application claims priority to German Application No. 102024114237.5, filed May 22, 2024, the entirety of which is hereby incorporated by reference.

FIELD OF THE INVENTION

The present invention relates to a lighting device for a motor vehicle, in particular a headlamp for a motor vehicle.

BACKGROUND OF THE INVENTION

Lighting devices with light-emitting diodes (LED) arranged in a matrix for the targeted generation of pixels in a light distribution generated outside the motor vehicle when the lighting device is in use are normally based on uniform pixel sizes with a symmetrical distribution of individual blocks that are connected to corresponding driver modules. Headlamps that are to generate a low beam light distribution with a matrix distribution that contains sector lines and a light/dark boundary, and a high beam light distribution, require a corresponding light source with a specific aspect ratio for the light distribution to meet legal requirements and/or customer demands. The necessary aspect ratio can normally be obtained using many pixels or larger pixels. Using many pixels leads to higher costs for the electronic components, while enlarging the pixels results in lower resolution in both the low beam and high beam lights.

DE 10 2019 132 236 A1 discloses a lighting device of this type. The lighting device described therein is a high-resolution headlamp. The headlamp contains a solid-state LED array with numerous light-emitting diodes, the light-emitting surfaces of which generate pixels outside the motor vehicle in a targeted manner when the lighting device is in use and are arranged in a matrix-like system of rows and columns, the rows of which generate a horizontal light distribution, while the columns generate a vertical light distribution, with more pixels in the rows than in the columns.

Using pixels of different sizes and shapes, e.g. squares and rectangles, makes it possible to implement the desired design with fewer pixels, while still obtaining the necessary aspect ratio. Control of the individual pixels, however, may be more complicated.

BRIEF SUMMARY OF THE INVENTION

The fundamental problem addressed by the present invention involves creating a lighting device of the aforementioned type with which the light sources can be operated with fewer electronic components and/or greater flexibility.

The lighting device is configured such that at least one first light-emitting diode is operated with a first current, and at least one second light-emitting diode is operated with a second current. The lighting device can thus contain different light-emitting diodes with light-emitting surfaces or pixels of different sizes that are operated with different currents. A first light-emitting diode with a first light-emitting surface that has a small pixel size is therefore operated with a lower current than a light-emitting diode with a second light-emitting surface that has a large pixel size. This may reduce costs, in particular for the control electronics, because it may require fewer driver modules, such that less space is needed on a printed circuit board populated with the light sources and the driver modules. The aspect ratio necessary for meeting the requirements for low and high beam lights can nevertheless be maintained.

The first and second light-emitting surface may have different shapes, in particular with the second light-emitting surface being taller than the first. The light source can also contain at least one third light-emitting diode with a third light-emitting surface that is larger than the first light-emitting surface, wherein the light source is configured to operate the at least one third light-emitting diode with a third current that is stronger than the first. The third current can be the same as the second current. The third light-emitting surface may have a different shape than the first and second light-emitting surfaces, in particular being wider than the first and second light-emitting surfaces, while the second light-emitting surface is taller than the third light-emitting surface. By using pixels of different sizes and shapes, it is possible to obtain a higher resolution than with systems that have more pixels.

The lighting device may be configured to control the light-emitting diodes individually or in groups to switch individual light-emitting diodes, groups of light-emitting diodes, or all of the light-emitting diodes on or off, in particular when the individual light-emitting diodes and/or groups thereof can be controlled individually.

The lighting device can contain at least one driver module, in particular numerous driver modules, each of which are configured to control numerous light-emitting diodes.

The light source may be configured to control the light-emitting diodes in a first configuration of the lighting device with at least one first driver module, in particular numerous first driver modules, and control the light-emitting diodes in a second configuration with at least one second driver module, in particular numerous second driver modules, in which the first and second driver modules differ with regard to the maximum number of light-emitting diodes they can control independently of one another, e.g. in which the first driver module can control a maximum of 16 light-emitting diodes independently of one another, and the second can control a maximum of 12 light-emitting diodes independently of one another. Consequently, the light sources in the lighting device can be combined in a variety of ways with different types of driver modules, such that the lighting device can be easily integrated in different types of motor vehicles. First and second driver modules normally cannot be used in the same configurations. Instead, there are usually configurations in which only the first type of driver modules can be used, or configurations in which only the second type of driver modules can be used.

The light-emitting diodes can be placed in at least two rows in the light sources, which extend horizontally and are vertically adjacent to one another, in particular with light sources that contain 48 light-emitting diodes. At least one of the rows of light-emitting diodes may contain at least one intermediate connection, in particular numerous intermediate connections, for the anodes and cathodes in the light-emitting diodes, such that there can be partial rows of light-emitting diodes on the left and right sides of the intermediate connections, in which the light-emitting diodes can be operated with different currents. These intermediate connections can be placed in the at least one row of light-emitting diodes in which the partial rows of light-emitting diodes can have a total number of light-emitting diodes that is divisible by four. By placing intermediate connections appropriately, the light sources can be integrated efficiently and flexibly in different wiring environments.

The lighting device can have a plug for connecting to at least one channel in a control unit, in particular numerous channels, in which the control unit is part of the lighting device or the motor vehicle. The lighting device can have a printed circuit board for this, populated with the light source, at least one driver module, and the plug.

There may be numerous signal lines in the at least one control channel, in particular each control channel, for controlling numerous light-emitting diodes. The light sources can be configured to connect the lighting device in a first configuration to numerous first control unit channels for controlling and supplying electricity to the light-emitting diodes, and to numerous second control unit channels in a second configuration, in which the first and second control unit channels differ with regard to the distribution of signal lines and power supply lines. This allows for the light sources to be connected efficiently to different types of control units with a certain flexibility.

The light sources can be solid-state arrays or contain solid-state arrays.

BRIEF DESCRIPTION OF THE DRAWINGS

Reference is now made more particularly to the drawings, which illustrate the best presently known mode of carrying out the invention and wherein similar reference char-acters indicate the same parts throughout the views.

DETAILED DESCRIPTION OF THE INVENTION

Figure 1:
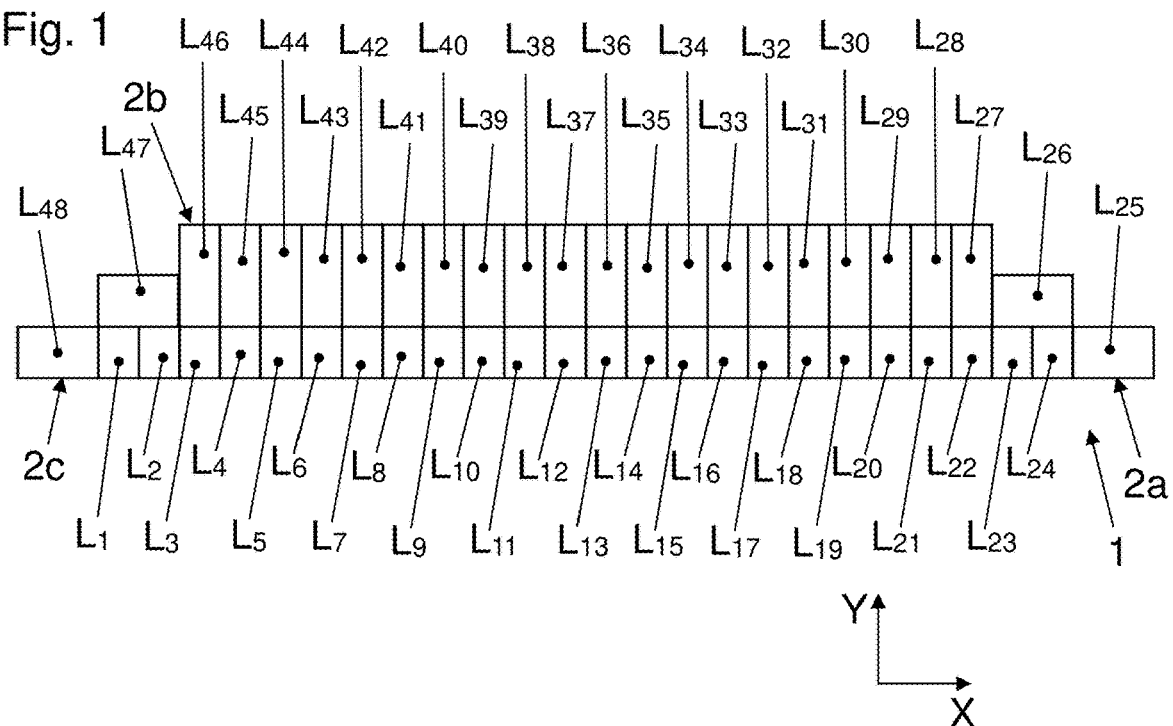
FIG. 1 shows a schematic view of the light-emitting surfaces in a light source in the lighting device obtained with the invention from above.

Identical and functionally identical parts have the same reference symbols in the drawings. A cartesian coordinate system is shown in FIG. 1.

The lighting device shown in the drawings is a headlamp. The lighting device contains a light source 1 in the form of a solid-state LED array. The light source 1 contains 48 light-emitting diodes (LEDs) 2a, 2b, 2c with which pixels are generated in a light distribution outside the motor vehicle when the headlamp is on, which can form a low or high beam light distribution.

Each light-emitting diode 2a, 2b, 2c has a light-emitting surface $L_1$-$L_{48}$, which are of different shapes and sizes. The light-emitting surfaces $L_1$-$L_{48}$ are in two rows in FIG. 1. The rows extend along the X-axis, and are placed above one another along the Y-axis. The X-axis extends horizontally in the light distribution generated outside the motor vehicle, while the Y-axis extends vertically.

The light source contains 24 first light-emitting diodes 2a, 20 second light-emitting diodes 2b, and 4 third light-emitting diodes 2c. The light-emitting surfaces $L_1$-$L_{24}$ on the first light-emitting diodes 2a are in the lower row in FIG. 1, and are substantially square. The light-emitting surfaces $L_{27}$-$L_{46}$ on the second light-emitting diodes 2b are in the upper row and substantially rectangular, with a longer vertical extension Y than horizontal X. The light-emitting surfaces $L_{25}$, $L_{26}$, $L_{47}$, and $L_{48}$ on the third light-emitting diodes 2c are at the outer ends of the upper and lower rows in FIG. 1. They each have a rectangular shape with a longer horizontal extension X than vertical Y.

The lighting device also contains numerous driver modules 3a, 3b, 3c and a plug 4 with which they are connected to control unit channels 5a, 5b, 5c, 5d extending from a control unit (not shown). The control unit can be part of the lighting device or part of the motor vehicle. There can be numerous signal lines 6 for controlling numerous light-emitting diodes and at least one power line 7 for the light-emitting diodes in each control unit channel 5a, 5b, 5c, 5d. The plug 4 can contain not only connectors for the four control unit channels 5a, 5b, 5c, 5d, but also connectors for other lines for a power supply or for connecting to a bus system, etc.

The lighting device also contains a printed circuit board (not shown), populated by the light source 1, driver modules 3a, 3b, 3c, and the plug 4. The wiring for the light source 1 and driver modules 3a, 3b, 3c with the signal lines 6 and power line 7 for the light-emitting diodes 2a, 2b, 2c is shown schematically in FIG. 2.

Figure 2:
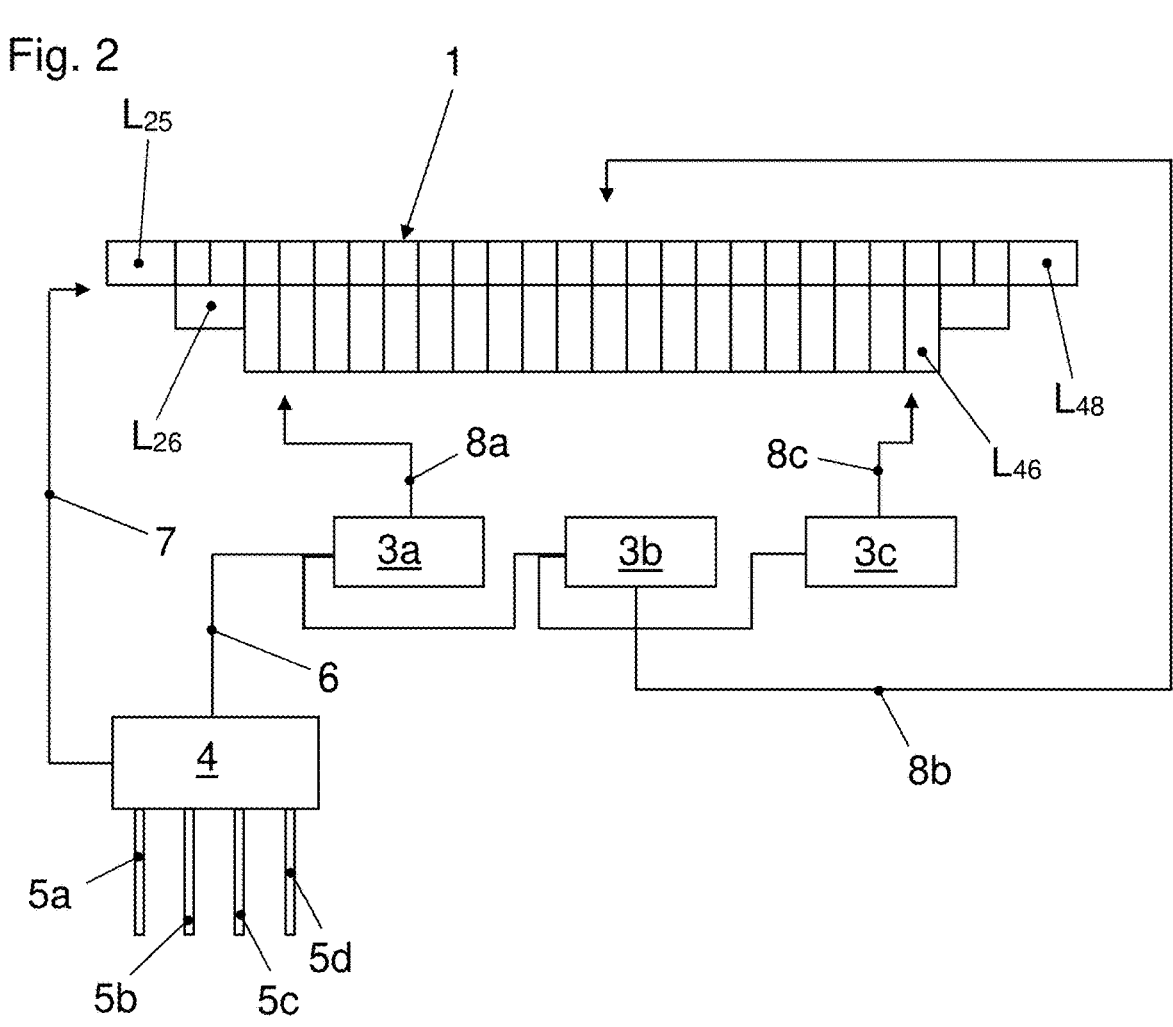
FIG. 2 shows a schematic view of the light source, numerous driver modules, and a plug for the lighting device shown in FIG. 1.

The signal lines 6 run in series from the plug 4 to the driver modules 3a, 3b, 3c. A control line 8a, 8b, 8c runs from each driver module 3a, 3b, 3c to a group of light-emitting diodes 2a, 2b, 2c, to control them with the signals from the signal lines 6. The power lines 7 run directly from the plug 4 to the light source 1 to supply the respective groups of light-emitting diodes 2a, 2b, 2c with electricity. Only one of these lines 7 is shown in FIG. 2. It is clear from FIGS. 3 to 5 that there is more than one line 7.

Figure 3:
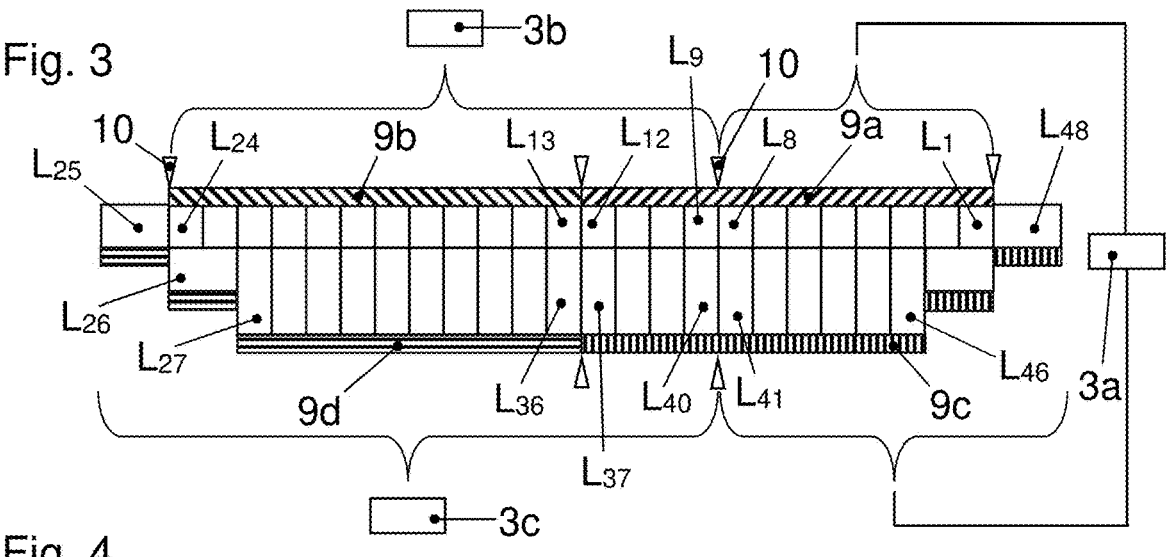
FIG. 3 shows a schematic illustration of a first configuration of the wiring for the lighting device shown in FIG. 1.

FIG. 3 shows a first configuration for the lighting device. The power supply through different lines 7 or control unit channels 5a, 5b, 5c, 5d is indicated by areas 9a, 9b, 9c, 9d with different shadings.

The area 9a at the top right side of the light-emitting surfaces $L_1$-$L_{12}$ in FIG. 3 shows that the first light-emitting diodes 2a for these light-emitting surfaces $L_1$-$L_{12}$ are supplied with power by the first control unit channel 5a.

The area 9b at the top left side of the light-emitting surfaces $L_{13}$-$L_{24}$ in FIG. 3 shows that the first light-emitting diodes 2a for these light-emitting surfaces $L_{13}$-$L_{24}$ are supplied with power by the second control unit channel 5b. Because the light-emitting surfaces $L_1$-$L_{24}$ on the first light-emitting diodes 2a are relatively small, the current can be lower than for the second and third light-emitting diodes 2b, 2c.

The area 9c at the lower right side of the light-emitting surfaces $L_{37}$-$L_{48}$ in FIG. 3 shows that the second and third light-emitting diodes 2b, 2c for these light-emitting surfaces $L_{37}$-$L_{48}$ are supplied with power by the third control unit channel 5c.

The area 9d at the lower left side of the light-emitting surfaces $L_{25}$-$L_{36}$ in FIG. 3 shows that the second and third light-emitting diodes 2b, 2c for these light-emitting surfaces $L_{25}$-$L_{36}$ are supplied with power by the fourth control unit channel 5d. Because the light-emitting surfaces $L_{25}$-$L_{36}$ for the second and third light-emitting diodes 2b, 2c are relatively large, they require a stronger current than the first light-emitting diodes 2a.

There are numerous intermediate connections 10 for the anodes and cathodes in the rows of light-emitting diodes 2a, 2b, 2c, thus forming partial rows of light-emitting diodes 2a, 2b, 2c to the right and left of each of the intermediate connections 10, in which the light-emitting diodes 2a, 2b, 2c can be operated with different currents. These intermediate connections 10 are placed in the rows of light-emitting diodes to form partial rows of light-emitting diodes 2a, 2b, 2c containing a total number of light-emitting diodes 2a, 2b, 2c divisible by four.

FIG. 3 also shows that the first light-emitting diodes 2a for the light-emitting surfaces $L_1$-$L_8$ and the second and third light-emitting diodes 2b, 2c for the light-emitting surfaces $L_{41}$-$L_{48}$ are controlled by the driver module 3a. The first light-emitting diodes 2a for the light-emitting surfaces $L_9$-$L_{24}$ are controlled by the driver module 3b. The second and third light-emitting diodes 2b, 2c for the light-emitting surfaces $L_{25}$-$L_{40}$ are controlled by the driver module 3c. Each of the driver modules 3a, 3b, 3c therefore controls 16 light-emitting diodes 2a, 2b, 2c.

Figure 4:
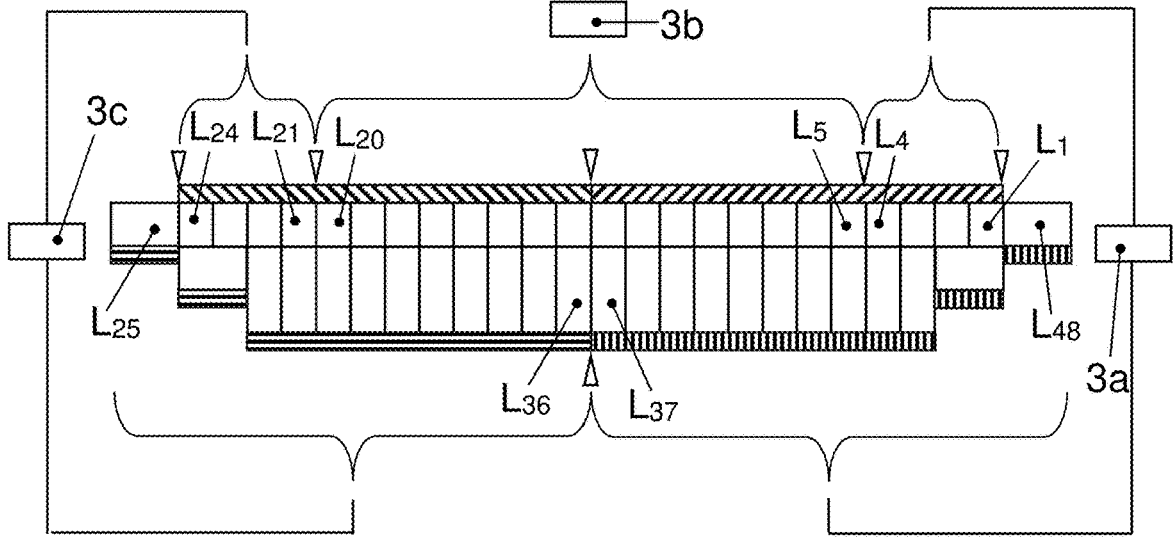
FIG. 4 shows a schematic illustration of a second configuration of the wiring for the lighting device shown in FIG. 1.

In the second configuration, shown in FIG. 4, power is supplied the same way as in the first configuration. The control of the light-emitting diodes 2a, 2b, 2c in the second configuration differs from that in the first.

FIG. 4 shows that the first light-emitting diodes 2a for the light-emitting surfaces $L_1$-$L_4$ and the second and third light-emitting diodes 2b, 2c for the light-emitting surfaces $L_{37}$-$L_{48}$ are controlled by the driver module 3a. The first light-emitting diodes 2a for the light-emitting surfaces $L_5$-$L_{20}$ are controlled by the driver module 3b. The first light emitting-diodes 2a for the light-emitting surfaces $L_{21}$-$L_{24}$ and the second and third light-emitting diodes 2b, 2c for the light-emitting surfaces $L_{25}$-$L_{36}$ are controlled by the driver module 3c.

Each driver module 3a, 3b, 3c in the second configuration therefore also controls 16 light-emitting diodes 2a, 2b, 2c. The driver modules 3a, 3b, 3c are first driver modules or first types of driver modules, which can control a maximum of 16 light-emitting diodes 2a, 2b, 2c independently of one another.

Figure 5:
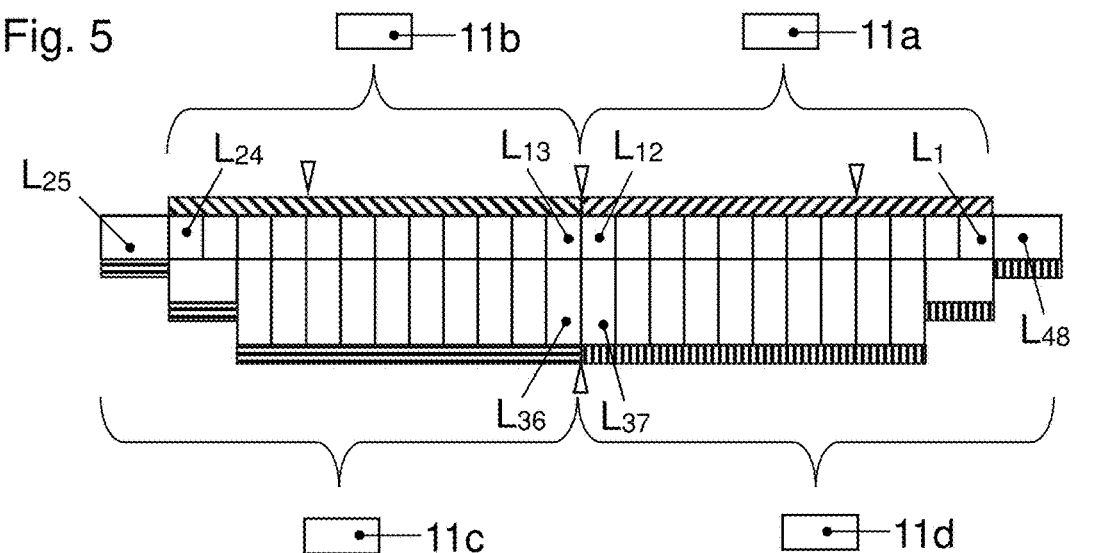
FIG. 5 shows a schematic illustration of a third configuration of the wiring for the lighting device shown in FIG. 1.

In the third configuration, shown in FIG. 5, power is supplied the same was as in the first and second configurations. The control of the light-emitting diodes 2a, 2b, 2c in the configuration in FIG. 5 differs from that in first and second configurations. Second driver modules 11a, 11b, 11c, 11d, or a second type of driver modules 11a, 11b, 11c, 11d, are used in the third configuration, which can control a maximum of 12 light-emitting diodes 2a, 2b, 2c independently of one another. This is why four driver modules 11a, 11b, 11c, 11d are needed to control the 48 light-emitting diodes 2a, 2b, 2c.

FIG. 5 shows that the first light-emitting diodes 2a for the light-emitting surfaces $L_1$-$L_{12}$ are controlled by the driver module 3a. The first light-emitting diodes 2a for the light-emitting surfaces $L_{12}$-$L_{24}$ are controlled by the driver module 3b. The second and third light-emitting diodes 2b, 2c for the light-emitting surfaces $L_{25}$-$L_{36}$ are controlled by the driver module 3c. The second and third light-emitting diodes 2b, 2c for the light-emitting surfaces $L_{37}$-$L_{48}$ are controlled by the driver module 3d. Each of the driver modules 3a, 3b, 3c, therefore controls 12 light-emitting diodes 2a, 2b, 2c.

LIST OF REFERENCE SYMBOLS 1 light source
2a first light-emitting diodes
2b second light-emitting diodes
2c third light-emitting diodes
3a, 3b, 3c first driver modules 4 plug
5a, 5b, 5c, 5d control channels
6 signal line
7 power line
8a, 8b, 8c control line
9a, 9b, 9c, 9d surfaces indicating the power supply through one of the control channels
10 intermediate connection
11a, 11b, 11c, 11d second driver modules
$L_1$-$L_{48}$ light-emitting surfaces
X horizontal axis
Y vertical axis

The invention claimed is:

1. A lighting device for a motor vehicle comprising:
a light source with numerous light-emitting diodes with which pixels in a light distribution generated outside the motor vehicle are generated in a targeted manner,
wherein each of the light-emitting diodes has a light-emitting surface ($L_1$-$L_{48}$),
wherein the light-emitting surfaces ($L_1$-$L_{48}$) are placed in first and second rows to form a matrix, in which the light distribution extends horizontally (X) and vertically (Y) outside the motor vehicle,
wherein the light source contains at least one first light-emitting diode with first light-emitting surfaces ($L_1$-$L_{24}$), and at least one second light-emitting diode with second light-emitting surfaces ($L_{27}$-$L_{46}$),
wherein the first light-emitting surfaces ($L_1$-$L_{24}$) are smaller than the second light-emitting surfaces ($L_{27}$-$L_{46}$),
wherein the at least one first light-emitting diode is configured to operate with a first current, and the at least one second light-emitting diode is configured to operate with a second current, wherein the first current is weaker than the second,
wherein the lighting device is configured such that the light-emitting diodes can be controlled individually or in groups to be able to switch individual light-emitting diodes, groups of light-emitting diodes, or all of the light-emitting diodes on and off,
wherein the lighting device contains at least one driver module,
wherein the light source is connected in a first configuration of the lighting device to at least one first drive module to control the light-emitting diodes, and connected in a second configuration of the lighting device to at least one second driver module to control the light-emitting diodes, wherein the first driver modules and second drive modules differ with regard to the maximum number of light-emitting diodes they can control independently.

2. The lighting device according to claim 1, wherein the first light-emitting surfaces ($L_1$-$L_{24}$) and second light-emitting surfaces ($L_{27}$-$L_{46}$) have different shapes.

3. The lighting device according to claim 2, wherein the second light-emitting surfaces ($L_{27}$-$L_{46}$) are taller than the first light-emitting surfaces ($L_1$-$L_{24}$) along the Y-axis.

4. The lighting device according to claim 1, wherein the light source contains at least one third light-emitting diode with third light-emitting surfaces ($L_{25}$, $L_{26}$, $L_{47}$, $L_{48}$), wherein the first light-emitting surfaces ($L_1$-$L_{24}$) are smaller than the third light-emitting surfaces ($L_{25}$, $L_{26}$, $L_{47}$, $L_{48}$), wherein the light source is configured to operate the at least one third light-emitting diode with a third current that is stronger than the first.

5. The lighting device according to claim 4, wherein the third light-emitting surfaces ($L_{25}$, $L_{26}$, $L_{47}$, $L_{48}$) have a different shape than the first light-emitting surfaces ($L_1$-$L_{24}$) and second light-emitting surfaces ($L_{27}$-$L_{46}$).

6. The lighting device according to claim 5, wherein the third light-emitting surfaces ($L_{25}$, $L_{26}$, $L_{47}$, $L_{48}$) are wider than the first light-emitting surfaces ($L_1$-$L_{24}$) and second light-emitting surfaces ($L_{27}$-$L_{46}$) along the X-axis, and wherein the second light-emitting surfaces ($L_{27}$-$L_{46}$) are taller than the third light-emitting surfaces ($L_{25}$, $L_{26}$, $L_{47}$, $L_{48}$) along the Y-axis.

7. The lighting device according to claim 1, wherein the light source is a solid-state LED array, or contains a solid-state LED array.

8. The lighting device according to claim 1, wherein the individual light-emitting diodes (2a, 2b, 2c) or groups of light-emitting diodes (2a, 2b, 2c) can be controlled independently.

9. The lighting device according to claim 1, wherein the at least one drive module is configured to control numerous light-emitting diodes.

10. The lighting device according to claim 1, wherein the first driver modules can control a maximum of 16 light-emitting diodes independently, and wherein the second driver modules can control a maximum of twelve light-emitting diodes independently.

11. A lighting device for a motor vehicle comprising:

a light source with numerous light-emitting diodes with which pixels in a light distribution generated outside the motor vehicle are generated in a targeted manner, wherein each of the light-emitting diodes has a light-emitting surface ($L_1$-$L_{48}$), wherein the light-emitting surfaces ($L_1$-$L_{48}$) are placed in first and second rows to form a matrix, in which the light distribution extends horizontally (X) and vertically (Y) outside the motor vehicle, wherein the light source contains at least one first light-emitting diode with first light-emitting surfaces ($L_1$-$L_{24}$), and at least one second light-emitting diode with second light-emitting surfaces ($L_{27}$-$L_{46}$), wherein the first light-emitting surfaces ($L_1$-$L_{24}$) are smaller than the second light-emitting surfaces ($L_{27}$-$L_{46}$), wherein the at least one first light-emitting diode is configured to operate with a first current, and the at least one second light-emitting diode is configured to operate with a second current, wherein the first current is weaker than the second, wherein light-emitting diodes in the light source are in at least two rows, wherein the rows extend horizontally (X) and are adjacent to one another vertically (Y), wherein at least one row of light-emitting diodes has at least one intermediate connection for the anodes and cathodes in the light-emitting diodes, such that partial rows of light-emitting diodes are formed to the left and right of each intermediate connection, in which the light-emitting diodes can be operated with different currents.

12. The lighting device according to claim 11, wherein the at least one intermediate connection is placed in the at least one row of light-emitting diodes such that the partial rows of light-emitting diodes formed by the intermediate connections contain a total number of light-emitting diodes divisible by four.

13. A lighting device for a motor vehicle comprising:

a light source with numerous light-emitting diodes with which pixels in a light distribution generated outside the motor vehicle are generated in a targeted manner, wherein each of the light-emitting diodes has a light-emitting surface ($L_1$-$L_{48}$), wherein the light-emitting surfaces ($L_1$-$L_{48}$) are placed in first and second rows to form a matrix, in which the light distribution extends horizontally (X) and vertically (Y) outside the motor vehicle, wherein the light source contains at least one first light-emitting diode with first light-emitting surfaces ($L_1$-$L_{24}$), and at least one second light-emitting diode with second light-emitting surfaces ($L_{27}$-$L_{46}$), wherein the first light-emitting surfaces ($L_1$-$L_{24}$) are smaller than the second light-emitting surfaces ($L_{27}$-$L_{46}$), wherein the at least one first light-emitting diode is configured to operate with a first current, and the at least one second light-emitting diode is configured to operate with a second current, wherein the first current is weaker than the second, wherein the lighting device has a plug for connecting to at least one control unit channel, wherein the at least one control unit channel comes from a control unit that is part of the lighting device or the motor vehicle, wherein the lighting device contains a printed circuit board populated with the light source, the at least one driver module, and the plug, wherein the light source is connected to numerous first control unit channels to control the light-emitting diodes and supply the light-emitting diodes with power in a first configuration of the lighting device, and connected to numerous second control unit channels to control the light-emitting diodes and provide the light-emitting diodes with power in a second configuration of the lighting device, wherein the numerous first control unit channels and numerous second control unit channels differ with regard to the distribution of signal lines and the power line to the individual control unit channels.

14. The lighting device according to claim 13, wherein the at least one control unit channel contains numerous signal lines for controlling numerous light-emitting diodes and at least one power line for the numerous light-emitting diodes.

* * * * *